US012294378B1

(12) United States Patent
Yu et al.

(10) Patent No.: US 12,294,378 B1
(45) Date of Patent: May 6, 2025

(54) OFFSET CALIBRATION METHOD AND CIRCUIT APPLIED TO COMPARATOR ARRAY

(71) Applicant: Jiangnan University, Wuxi (CN)

(72) Inventors: Zhiguo Yu, Wuxi (CN); Hai Zhou, Wuxi (CN); Xiaoyu Zhong, Wuxi (CN); Xiaofeng Gu, Wuxi (CN)

(73) Assignee: Jiangnan University, Wuxi (CN)

( * ) Notice: Subject to any disclaimer, the term of this patent is extended or adjusted under 35 U.S.C. 154(b) by 0 days.

(21) Appl. No.: 19/011,735

(22) Filed: Jan. 7, 2025

Related U.S. Application Data

(63) Continuation of application No. PCT/CN2024/117983, filed on Sep. 10, 2024.

(30) Foreign Application Priority Data

Mar. 20, 2024 (CN) .................. 202410321001.X

(51) Int. Cl.
*H03K 5/24* (2006.01)
*H03M 1/10* (2006.01)

(52) U.S. Cl.
CPC .......... *H03K 5/2481* (2013.01); *H03K 5/249* (2013.01); *H03M 1/1023* (2013.01)

(58) Field of Classification Search
CPC ...... H03K 5/007; H03K 5/24; G01R 19/0038; H03M 1/462; H03M 1/0607; H03M 1/1023; H03F 3/45475
See application file for complete search history.

(56) References Cited

U.S. PATENT DOCUMENTS

| 5,990,814 A | 11/1999 | Croman et al. |
| 6,084,538 A | 7/2000 | Kostelnik et al. |

(Continued)

FOREIGN PATENT DOCUMENTS

| CN | 110149117 A | * | 8/2019 |
| CN | 112751565 A | | 5/2021 |

(Continued)

OTHER PUBLICATIONS

Lu, Chunhong et al. "A KICA-based pattern matching approach for dynamic process monitoring and fault diagnosis" Computer and Applied Chemistry. 32(2) Feb. 28, 2015.

*Primary Examiner* — Quan Tra
(74) *Attorney, Agent, or Firm* — IPRO, PLLC; Na Xu

(57) ABSTRACT

Disclosed are an offset calibration method and circuit applied to a comparator array. The offset calibration circuit includes a global calibration voltage generation module, integrators, comparators, a global logic control circuit, and local logic control circuits; an entire comparator array shares the single global calibration voltage generation module, and each of the comparators only needs to introduce an integrator circuit, such that a large calibration range and a small calibration step are achieved, a long calibration cycle and a large circuit area are required, and the requirements for a low area are satisfied. The offset calibration method provided by the present disclosure is similar to a binary search algorithm, which is adopted to search for the offset voltage, the calibration step of $$\frac{1}{2^N} Vref$$

(Continued)

can be realized by only N cycles, and short calibration time is thus realized.

9 Claims, 5 Drawing Sheets

(56) References Cited

U.S. PATENT DOCUMENTS

| | | | | |
|---|---|---|---|---|
| 2011/0109348 A1* | 5/2011 | Chen | ............... | H03K 5/2481 327/65 |
| 2020/0235749 A1* | 7/2020 | Wang | ............... | H03M 3/34 |
| 2023/0283286 A1* | 9/2023 | Wen | ............... | H03M 1/462 341/122 |

FOREIGN PATENT DOCUMENTS

| | | | |
|---|---|---|---|
| CN | 113765519 A | * | 12/2021 |
| CN | 115694491 A | | 2/2023 |
| CN | 116781048 A | | 9/2023 |
| CN | 117278868 A | | 12/2023 |
| JP | 2001036507 A | | 2/2001 |

* cited by examiner

OFFSET CALIBRATION METHOD AND CIRCUIT APPLIED TO COMPARATOR ARRAY

TECHNICAL FIELD

The present disclosure belongs to the field of integrated circuit design, and relates to an offset calibration method and circuit applied to a comparator array.

BACKGROUND

In fields of image sensors, computing-in-memory and the like, although a device size is continuously reducing due to the development of technology, an array size of the device is constantly increasing. As a result, more readout circuits for reading output current from an array are required, which is contrary to a trend of increasingly smaller device size. Therefore, it is necessary to design a readout circuit with a lower area. In the fields of image sensors, computing-in-memory and the like, the processing of a column-level signal usually requires one analog-to-digital converter (ADC) for each column, or one ADC for a plurality of columns, where the performance of the ADC has a significant impact on the performance of an entire system. As a key module in the ADC, a comparator needs to meet performance requirements such as low area and low offset. However, with fluctuations of process parameters, the comparator exhibits a normal distribution of offset voltages, and its equivalent input offset voltages may reach several millivolts, which reduces a dynamic input range of ADC and weakens the performance of ADC.

In order to reduce the offset voltage and improve the performance of comparator, a first method is to use a larger-sized device, which, however, will increase an area and load of the device. A second method is to introduce a calibration circuit to calibrate the comparator, such that the offset voltage is measured and corrected through the calibration circuit to complete the calibration of the comparator. For the second method, the effectiveness of calibration technology is mainly evaluated based on the performance of the circuit after calibration, an additional area and power consumption caused by the calibration, as well as calibration time.

At present, the common calibration methods include an offset voltage storage method represented by automatic zeroing and correlated double sampling, and an analog fine-tuning method using digital assistance. Specifically, the offset voltage storage method involves introducing an additional calibration cycle before each comparison cycle and introducing a capacitive load on a signal path, which will reduce a response speed of the comparator, and is thus unsuitable for high-speed dynamic comparators. The analog fine-tuning method using digital assistance involves applying a digitally-controlled calibration voltage on a signal path of the comparator to cancel out an offset voltage with the calibration voltage, such that the calibration is completed. The calibration method only requires calibration before the comparator works normally, without introducing any additional comparison cycle when the comparator works normally. Therefore, the calibration method is suitable for the calibration of high-speed comparators. However, calibration accuracy and a calibration circuit area contradict with calibration time. In order to achieve a large calibration range and a small calibration step, a long calibration cycle and a large circuit area are required. The existing calibration circuit of the comparator array usually adopts a method of configuring an independent calibration circuit for each comparator, which not only leads to excessive area consumption but also causes mismatch between comparators.

SUMMARY

In order to solve one or more of the above problems, the present disclosure provides an offset calibration method and circuit applied to a comparator array, so as to realize offset calibration with low area cost, short calibration period of time and high calibration accuracy.

A first objective of the present disclosure is to provide an offset calibration circuit applied to a comparator array, including global calibration voltage generation module, integrators, comparators, a global logic control circuit, and local logic control circuits, where input of the global logic control circuit is a calibration enable signal and a clock signal, and an output terminal of the global logic control circuit is connected to a control terminal of the global calibration voltage generation module and is configured to generate a control signal required by the global calibration voltage generation module; an output terminal of the global calibration voltage generation module is connected to input terminals of the integrators and is configured to generate a voltage required for calibrating the entire comparator array; one comparator is arranged for every two integrators, output terminals of the two integrators are connected to calibration terminals of one comparator, respectively, and the integrators are configured to integrate the voltage generated by the global calibration voltage generation module in a calibration phase, and to maintain the calibration voltage after integration in a normal working phase of the comparator; and input terminals of the local logic control circuits are connected to output terminals of the comparators, output terminals of the local logic control circuits are connected to control terminals of the integrators and are configured to generate control signals required by the integrators.

In one embodiment, one comparator has two calibration terminals Vcal_P and Vcal_N, and the calibration terminals Vcal_P and Vcal_N are gates of calibration pair transistors connected in parallel with input pair transistors of the comparator or are substrates of the input pair transistors of the comparator.

In one embodiment, when the calibration is started, the global logic control circuit generates a control signal to control the global calibration voltage generation module to generate a global calibration voltage Vgcal with sequentially magnitudes of Vref, $$\frac{1}{2}Vref, \frac{1}{4}Vref \ldots \ldots \frac{1}{2^N}Vref$$

after the comparator makes comparison each time, where a reference voltage Vref and N determine a calibration range and calibration accuracy of the global calibration voltage generation module; a larger the reference voltage Vref is, a greater a range of the offset calibration becomes, such that a relatively large offset can be calibrated; and a smaller the $$\frac{1}{2^N}Vref$$

is, a smaller a calibration step becomes, such that a higher calibration accuracy can be realized.

In one embodiment, the global calibration voltage generation module is composed of a capacitor array, a reset switch, a switch array and a buffer, where the capacitor array is connected in parallel, a lower plate of each of the capacitors is connected to one switch, an upper plate of each of the capacitors is connected to a positive terminal of the buffer, and a negative terminal of the buffer is connected to the global calibration voltage Vgcal; and the switch array is connected to the global logic control circuit, the global logic control circuit controls each of the switches to be connected to a reference voltage or a ground, the reset switch is connected in parallel to the capacitor array; and when the reset switch is closed, upper plates of all of the capacitors are connected to the reference voltage for resetting the capacitor array.

In one embodiment, the integrators consist of switches $S_{int1}$-$S_{int5}$, capacitors $C_{int1}$-$C_{int3}$, a 2× gain amplifier, and one selector, the capacitors $C_{int1}$-$C_{int3}$ have equal capacitance, and the selector is controlled by a control signal CRE:

When the CRE is at a high level, an upper plate of the capacitor $C_{int2}$ is connected between the switch $S_{int2}$ and the switch $S_{int3}$, while the capacitor $C_{int3}$ is connected to an output terminal of one integrator;

when the CRE is at a low level, an upper plate of the capacitor $C_{int3}$ is connected between the switch $S_{int2}$ and the switch $S_{int3}$, while the capacitor $C_{int2}$ is connected to an output terminal of one integrator; and the global calibration voltage Vgcal is connected to an upper plate of the capacitor $C_{int1}$ through the switch $S_{int1}$, the upper plate of the capacitor $C_{int1}$ is connected to an upper plate of the capacitor $C_{int2}$ through the switch $S_{int2}$, the upper plate of capacitor $C_{int2}$ is connected to an input terminal of the 2× gain amplifier through the switch $S_{int3}$, an output terminal of the 2× gain amplifier is connected to the calibration terminal Vcal_P or Vcal_N of the comparator through the switch $S_{int4}$, an upper plate of the capacitor $C_{int3}$ is connected to an output terminal, lower plates of all of the capacitors are connected to the ground, and the reset switch $S_{int5}$ is connected in series with the output terminal and the ground for resetting an output voltage.

A second objective of the present disclosure is to provide an offset calibration method for the offset calibration circuit applied to a comparator array, which is implemented by adopting the above offset calibration circuit, and the method includes:

step 1: when a comparator starts the calibration, input terminals of the comparator VIP and VIN are both connected to a common-mode voltage Vcm; local calibration terminals Vcal_P and Vcal_N of the comparator, and a global calibration voltage Vgcal are reset, and the comparator outputs first comparison results;

step 2: a local logic control circuit determines a calibration side according to the first comparison results of the comparator in the step 1, an integrator integrates the global calibration voltage, such that a voltage at the Vcal_P is increased by Vref, or a voltage at the Vcal_N is increased by Vref; and the comparator outputs second comparison results;

step 3: a global logic control circuit controls a global calibration voltage generation module, such that a global calibration voltage is reduced from Vref to $$\frac{1}{2}Vref;$$

step 4: the local logic control circuit determines a calibration side according to the second comparison results of the comparator in the step 2, the integrator integrates the global calibration voltage Vgcal, such that a voltage at the Vcal_P is increased by $$\frac{1}{2}Vref,$$

or a voltage at the Vcal Nis increased by $$\frac{1}{2}Vref;$$

and the comparator outputs third comparison results; and step 5: the operations in the steps 3 and 4 are repeated until the global calibration voltage Vgcal reaches $$\frac{1}{2^N}Vref,$$

in which case, a last integration is performed according to the previous comparison results, and after the integration is completed, voltages at the output terminals Vcal_P and Vcal_N of the integrator are calibration voltages of a local comparator, and offset calibration of the comparator is completed.

In one embodiment, a method that the local logic control circuit determines a calibration side is as follows:

when the comparator outputs a high level after one comparison in the calibration phase is completed, a voltage at the Vcal_N terminal will be increased by the global calibration voltage Vgcal through the integrator, while a voltage at the Vcal_P terminal remains unchanged; and when the comparator outputs a low level after one comparison in the calibration phase is completed, a voltage at the Vcal_P terminal will be increased by the global calibration voltage Vgcal through the integrator, while a voltage at the Vcal_N terminal remains unchanged.

A third objective of the present disclosure is to provider an image sensor, which adopts the above offset calibration circuit applied to a comparator array.

A fourth objective of the present disclosure is to provide a computing-in-memory chip, which adopts the above offset calibration circuit applied to a comparator array.

A fifth objective of the present disclosure is to provide application of the above offset calibration circuit applied to a comparator array or the offset calibration method for the offset calibration circuit applied to a comparator array in the field of integrated circuit design.

The present disclosure has the beneficial effects:

(1) The offset calibration circuit applied to a comparator array provided by the present disclosure can achieve a large calibration range and a small calibration step by simply adjusting the voltage generated by the global calibration voltage generation module. The entire comparator array shares a single global calibration voltage generation module, and each of the comparators only needs to introduce an integrator circuit and a local logic control circuit, thereby solving the contradiction between calibration accuracy and area, and meeting the requirement for low area. In addition, since the global calibration voltage generation module is shared, the mismatch between the comparators caused by traditional independent calibration circuit is reduced, and the array-level matching is improved.

(2) The offset calibration method provided by the present disclosure is similar to a binary search algorithm, which is adopted to search for the offset voltage, the calibration step of $$\frac{1}{2^N} Vref$$

can be realized by only N cycles, and short calibration time is thus realized.

(3) The present disclosure can flexibly adjust the calibration accuracy by adjusting the global calibration voltage generation module, exhibiting strong technical portability.

BRIEF DESCRIPTION OF THE DRAWINGS

In order to more clearly illustrate the technical solution in the embodiments of the present disclosure, the accompanying drawings required to be used in the description of the embodiments are simply introduced below, and obviously, the accompanying drawings described below are only some embodiments of the present disclosure, such that for those of ordinary skill in the art, other drawings may further be derived from these drawings without making inventive efforts.

DETAILED DESCRIPTIONS OF THE EMBODIMENTS

Figure 1:
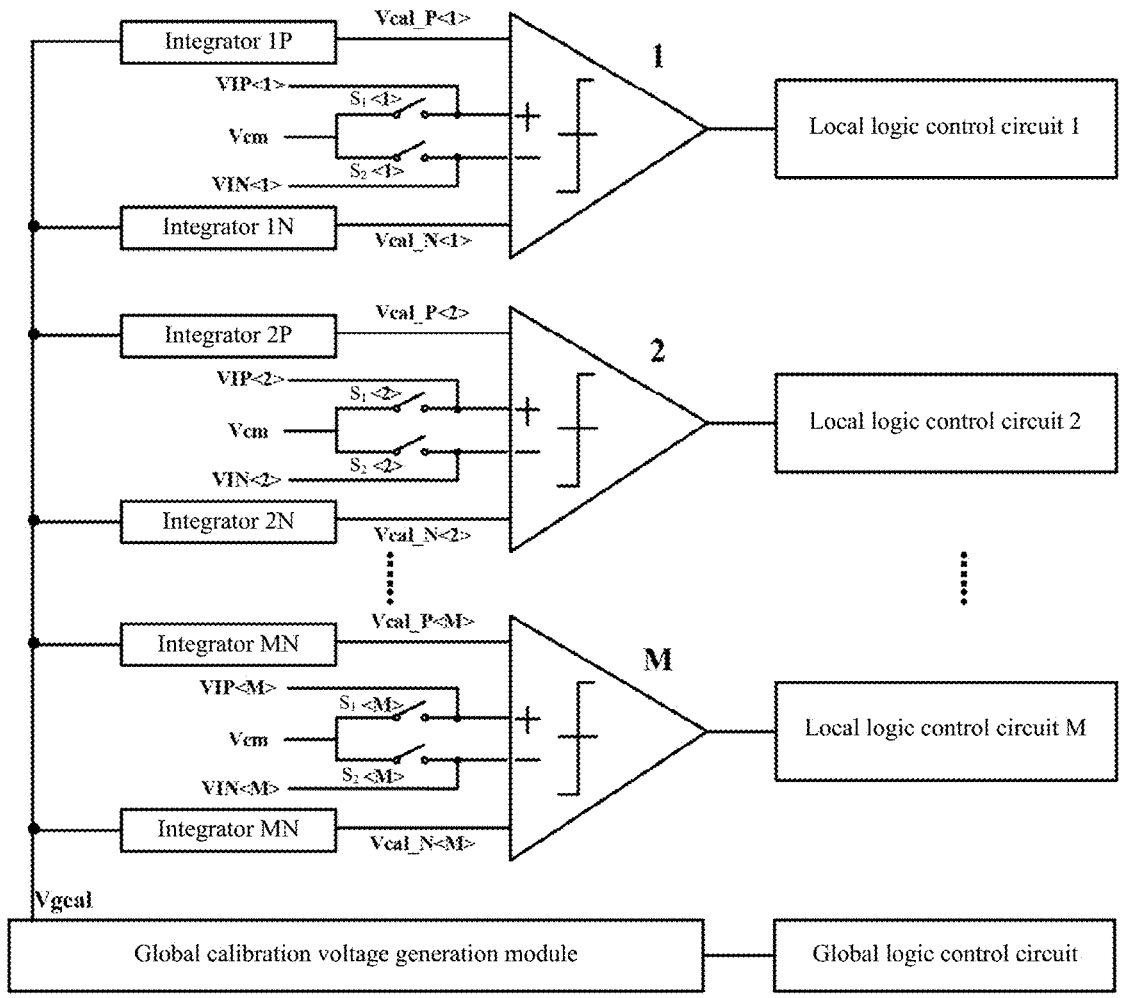
FIG. 1 is an overall architecture diagram of an offset calibration circuit applied to a comparator array according to the present disclosure.

The technical solutions of embodiments of the present disclosure will be described below clearly and comprehensively in conjunction with accompanying drawings, and identical or similar reference numerals denote identical or similar elements or elements in the embodiments have identical or similar functions. The embodiments described are merely some embodiments rather than all embodiments of the present disclosure. Based on the described embodiments, all other embodiments attainable by those ordinarily skilled in the art without involving any inventive effort are within the protection scope of the present disclosure.

Embodiment 1

This embodiment provides an offset calibration circuit applied to a comparator array, and as shown in FIG. 1, the circuit includes a global calibration voltage generation module, integrators, comparators, a global logic control circuit, and local logic control circuits.

Input of the global logic control circuit is a calibration enable signal (EN) and a clock signal (CLK), and an output terminal of the global logic control circuit is connected to an input terminal of the global calibration voltage generation module and is configured to generate a control signal required by the global calibration voltage generation module. An output terminal of the global calibration voltage generation module is connected to input terminals of the integrators and is configured to generate a voltage required for calibrating the entire comparator array; one comparator is arranged for every two integrators, an output end of one of the integrators is connected to a calibration terminal Vcal_P of the comparator, an output end of the other integrator is connected to a calibration terminal Vcal_N of the comparator, and the integrators are configured to integrate the voltage generated by the global calibration voltage generation module in a calibration phase, and to maintain the calibration voltage after integration in a normal working phase of the comparator; the two calibration terminals Vcal_P and Vcal_N of the comparator are gates of calibration pair transistors connected in parallel with input pair transistors of the comparator or are substrates of the input pair transistors of the comparator; and input terminals of the local logic control circuits are connected to output terminals of the comparators, output terminals of the local logic control circuits are connected to control terminals of the integrators and are configured to generate control signals required by the integrators (in order to avoid clutter in the drawing, lines connecting the output terminals of the local logic control circuits to the control terminals of the integrators are not shown in FIG. 1).

Embodiment 2

Figure 2:
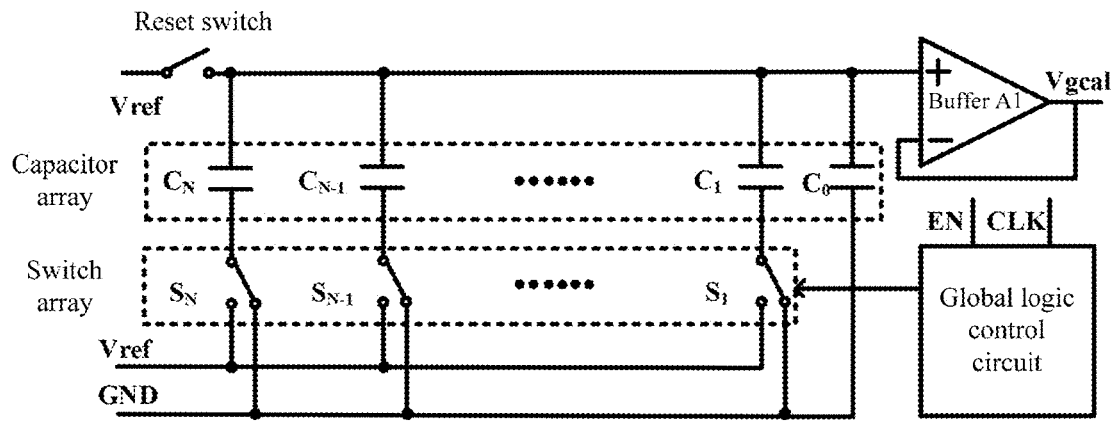
FIG. 2 is a schematic diagram of a global calibration voltage generation module according to Embodiment 2 of the present disclosure.

This embodiment provides an offset calibration circuit applied to a comparator array, which is implemented based on Embodiment 1. As shown in FIG. 2, a global calibration voltage generation module of this embodiment is composed of a capacitor array, a reset switch, a switch array $S_1$-$S_N$, and a buffer A1, where the capacitor array includes capacitors $C_0$-$C_N$, the switch array includes switches $S_1$-$S_N$, each of the capacitors in the capacitor array is connected to one switch in the switch array and then connected in parallel, a lower plate of each of the capacitors is connected to the switch, and an upper plate of each of the capacitors is connected to a positive terminal of the buffer. A negative terminal of the buffer A1 is connected to a global calibration voltage Vgcal; the switch array $S_1$-$S_N$ is connected to the global logic control circuit, and the global logic control circuit controls each of the switches to be connected to a reference voltage or a ground; and the reset switch is configured to reset the capacitor array. When one switch in the switch array is closed, the upper plate of the corresponding capacitor is connected to the reference voltage Vref.

When N=6, capacitance values of the capacitors $C_0$-$C_6$ are C, C, 2C, 4C, . . . , $2^5C$, respectively, where C represents a capacitance value of a unit capacitor. The buffer A1 is configured to isolate the capacitor array from the integrators and provide driving capability. The global logic control circuit generates control signals required for the reset switch and the switch array, output of the global logic control circuit is a calibration enable signal (EN) and a clock signal (CLK). By detecting high and low levels of the EN at a rising edge of CLK, it is determined whether the circuit is in a calibration mode or in a normal working mode of a comparator:

when the rising edge of CLK comes and the EN is at the low level, the comparator enters an normal working mode, in which case, the global logic control circuit generates control signals, the switch array $S_1$-$S_N$ are connected to the reference voltage Vref, the reset switch is closed at the same time, and the global calibration voltage Vgcal is Vref;

when the rising edge of CLK comes and the EN is at the high level, the circuit enters the calibration mode. First, the reset switch is disconnected, and signals of other switches remain unchanged; after one clock cycle, the global logic control circuit generates a control signal for the switch $S_N$, such that the switch is connected to the ground, in which case, the global calibration voltage Vgcal is $$\frac{1}{2} Vref;$$

after another clock cycle, the switch $S_{N-1}$ is connected to the ground, and the global calibration voltage Vgcal is $$\frac{1}{4} Vref;$$

and after N clock cycles, the global calibration voltage Vgcal is $$\frac{1}{2^N} Vref;$$

and the integrators in this embodiment are configured to integrate the global calibration voltage, and the control signals required are generated by a local logic control circuit. The offset calibration circuit in this embodiment includes comparators 1-M, each of the comparators corresponds to two integrators P and N, input of the two integrators are the global calibration voltage, output of one of the integrators P is connected to a local calibration terminal Vcal_P of the comparator, the other integrators N is connected to a calibration terminal Vcal_N, and all control signals of the two comparators are independent.

Figure 3:
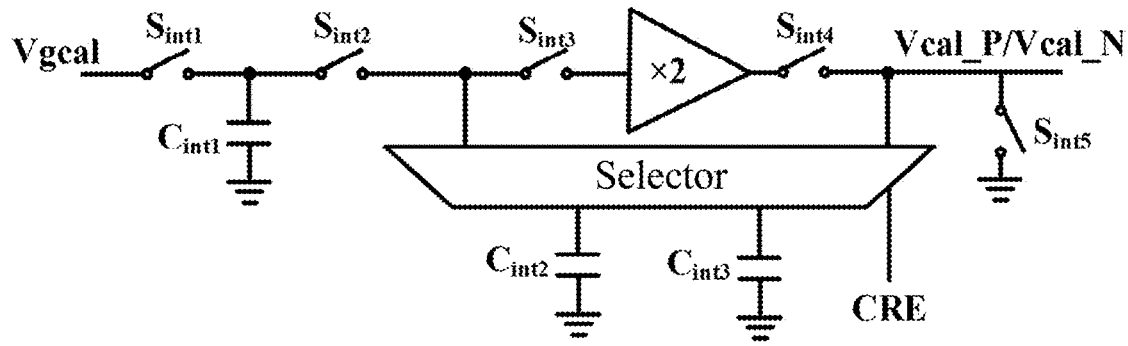
FIG. 3 is a schematic diagram of an integrator according to Embodiment 2 of the present disclosure.

With reference to FIG. 3, each of the integrators consists of switches $S_{int1}$-$S_{int5}$, capacitors $C_{int1}$-$C_{int3}$, a 2× gain amplifier, and one selector, and the capacitors $C_{int1}$-$C_{int3}$ are equal. The selector is controlled by a control signal CRE. When the CRE is at a high level, an upper plate of the capacitor $C_{int2}$ is connected between the switch $S_{int2}$ and the switch $S_{int3}$, while the capacitor $C_{int3}$ is connected to an output terminal of one integrator; and when the CRE is at a low level, an upper plate of the capacitor $C_{int3}$ is connected between the switch $S_{int2}$ and the switch $S_{int3}$, while the capacitor $C_{int2}$ is connected to an output terminal of one integrator. The global calibration voltage Vgcal is connected to an upper plate of the capacitor Cinti through the switch $S_{int1}$, the upper plate of the capacitor $C_{int1}$ is connected to an upper plate of the capacitor $C_{int2}$ through the switch $S_{int2}$, the upper plate of capacitor $C_{int2}$ is connected to an input terminal of the 2× gain amplifier through the switch $S_{int3}$, an output terminal of the 2× gain amplifier connected to the local calibration terminal Vcal_P or Vcal_N of the comparator through the switch $S_{int4}$, the upper plate of the capacitor $C_{int3}$ is connected to an output terminal of one integrator, lower plates of all of the capacitors are connected to the ground, and the reset switch $S_{int5}$ is connected in series with the output terminal and the ground for resetting an output voltage. The local logic control circuit generates control signals for the switches $S_{int1}$-$S_{int5}$. When the circuit enters the calibration mode, the global calibration voltage Vgcal is Vref during a first clock cycle, in which case, the local logic control circuit determines and controls the integrators to integrate the calibration terminals Vcal_P or Vcal_N according to comparison results of the comparators. The integration principles of the integrators are as follows:

the local logic control circuit generates the control signals for the switches $S_{int1}$-$S_{int5}$. In one clock cycle, the switch $S_{int1}$ is closed, and the switches $S_{int2}$-$S_{int4}$ are disconnected, in which case, the capacitor Cinti samples the global calibration voltage Vgcal for the clock cycle; when the clock cycle is the first clock cycle, the Vgcal is Vref and the switch $S_{int5}$ is closed, and charge on the capacitor $C_{int3}$ is cleared; in a second clock cycle, the switch $S_{int1}$, is disconnected, the switch $S_{int2}$ is closed, the switch $S_{int5}$ is disconnected, the CRE is at a low level, in which case, the capacitor $C_{int1}$ and the capacitor $C_{int3}$ share the charge; after sharing the switch $S_{int2}$ is immediately disconnected, the switches $S_{int1}$, $S_{int3}$, and $S_{int4}$ are closed, in which case, an output voltage at the calibration terminal is Vref, and integration is completed; the capacitor $C_{int1}$ samples the global calibration voltage Vgcal for the second clock cycle at the same time; when a third clock cycle comes, the switch $S_{int1}$ is disconnected, the switch $S_{int2}$ is closed, the switch $S_{int5}$ is disconnected, and the CRE is at a high level, in which case, the capacitor $C_{int1}$ and the capacitor $C_{int2}$ share charge; after sharing, the switch $S_{int2}$ is immediately disconnected, and the switches $S_{int1}$, $S_{int3}$ and $S_{int4}$ are closed, in which case, an output voltage of the calibration terminal is $$\frac{3}{2} Vref,$$

and the capacitor Cinti samples the global calibration voltage Vgcal for the third clock cycle. The above operation can be repeated in the subsequent integration process.

Figure 4:
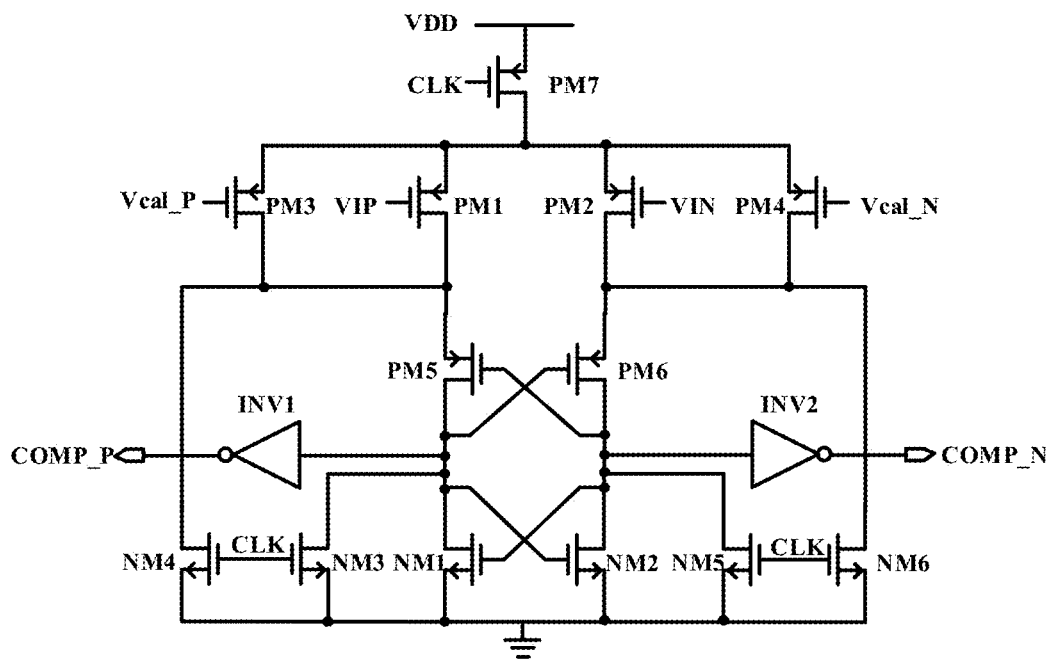
FIG. 4 is a schematic diagram of a comparator that gates of calibration pair transistors connected in parallel with input pair transistors of the comparator are taken as calibration terminals according to Embodiment 2 of the present disclosure.
Figure 5:
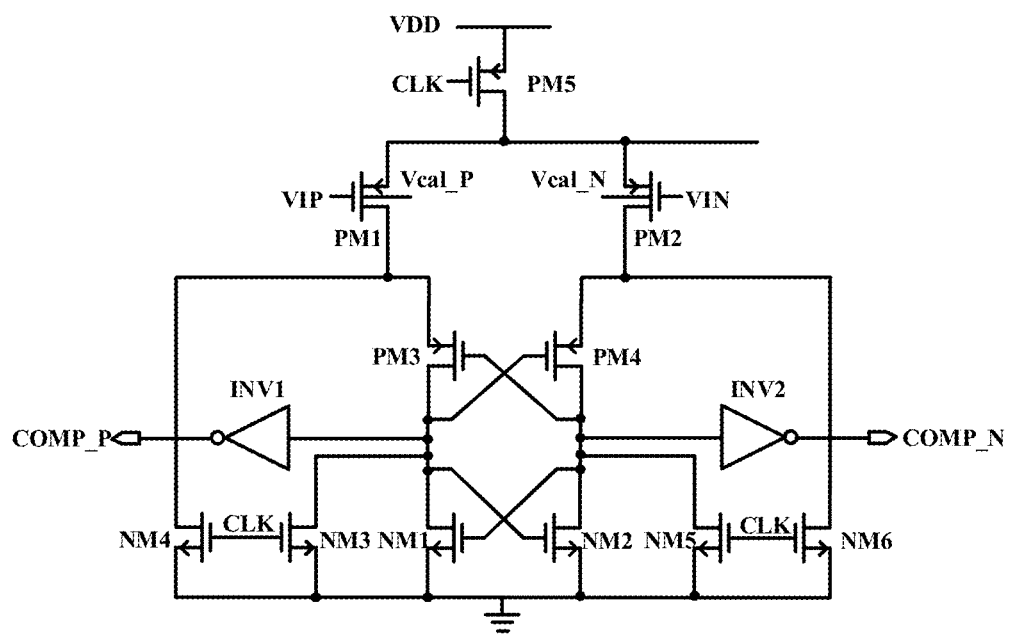
FIG. 5 is a schematic diagram of a comparator that substrates of calibration pair transistors of the comparator are taken as calibration terminals according to Embodiment 2 of the present disclosure.

The comparator of this embodiment is shown in FIGS. 4 and 5. The comparator is composed of PMOS transistors PM1-PM7, NMOS transistors NM1-NM6 and inverters INV1-INV2, input terminals of the comparator are VIP and VIN, calibration terminals thereof are Vcal_P and Vcal_N, the calibration terminals are led out through calibration pair transistors that are parallel to comparator input pair transistors or directly through the comparator input pair transistors; the comparator is controlled by the clock signal CLK; when the CLK is at a high level, the comparator is reset, in which case, output terminals COMP_P and COMP_N are both at a high level; when the CLK is at a low level, the comparator compares a voltage at the input terminal VIP with that at the input terminal VIN; when the voltage at the VIP is higher than that at the VIN, the output terminal COMP_P is at a higher level, while the output terminal COMP_N is at a low level; and on the contrary, when the voltage at the VIN is higher than that at the VIP, the output terminal COMP_N is at a high level, and output terminal COMP_P is at a low level.

FIG. 4 is a schematic diagram of calibration terminals that are led out through calibration pair transistors that are parallel to comparator input pair transistors, where PM1 and PM2 are the comparator input pair transistors, with their gates led out the input terminals VIP and VIN; and PM3 and PM4 are the calibration pair transistors that are connected in parallel with the comparator input pair transistors PM1 and PM2, respectively, with their gates led out the calibration terminals Vcal_P and Vcal_N.

FIG. 5 is a schematic diagram of calibration terminals that are led out directly through the comparator input pair transistors, where gates of the comparator input pair transistors PM1 and PM2 led out the input terminals VIP and VIN, and their substrates lead out the calibration terminals Vcal_P and Vcal_N.

Figure 6:
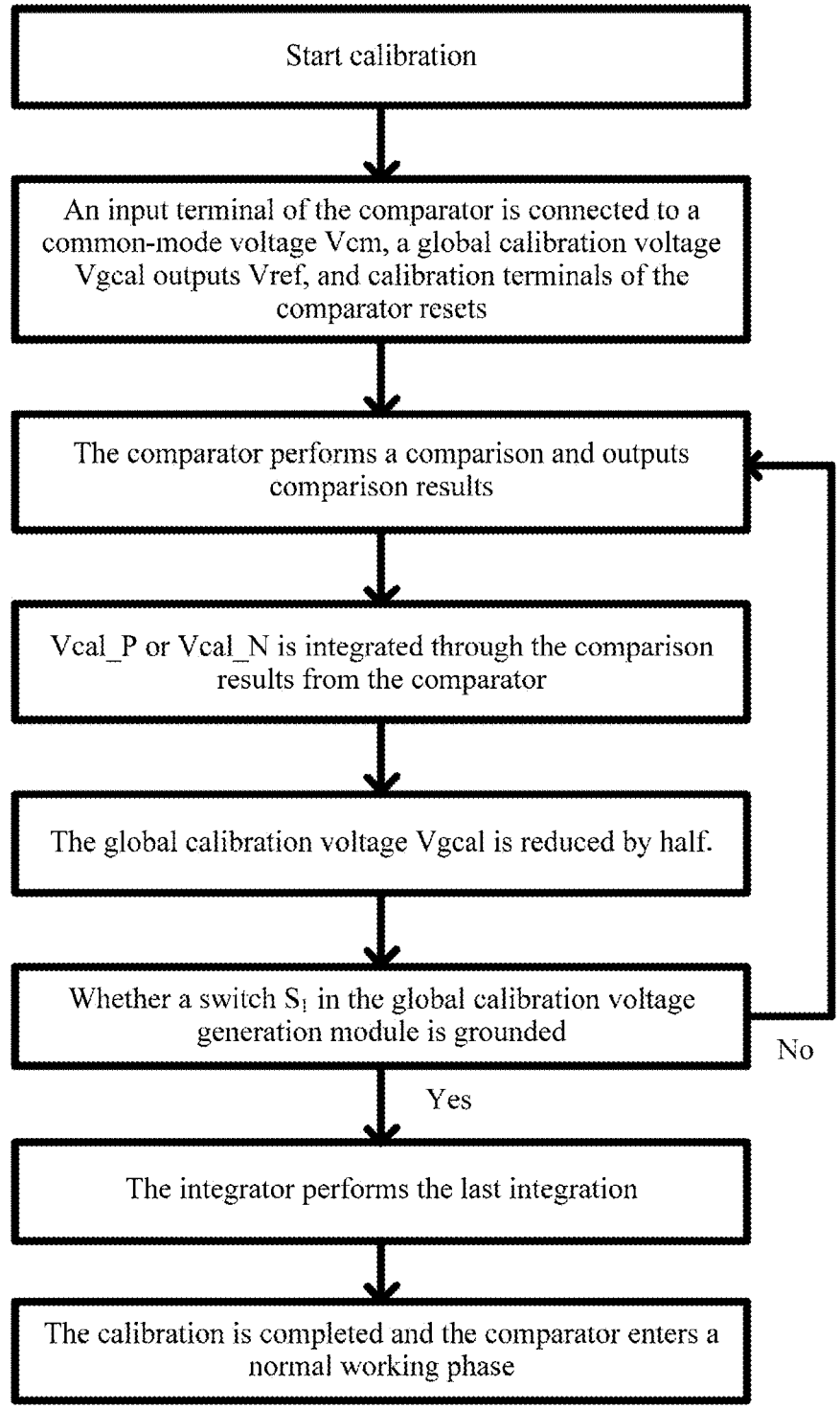
FIG. 6 is a flowchart of calibration of a comparator according to Embodiment 2 of the present disclosure.
Figure 7:
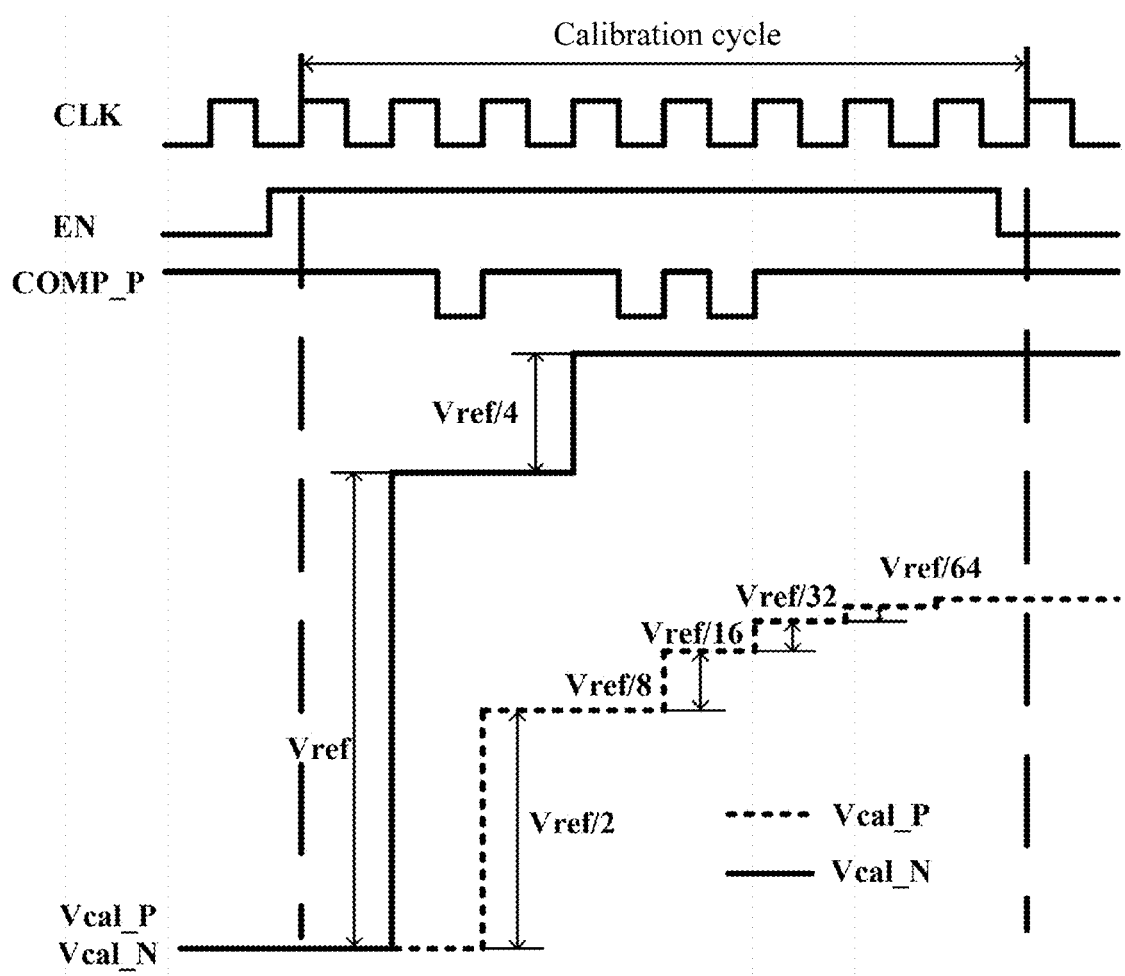
FIG. 7 is a calibration timing diagram according to Embodiment 2 of the present disclosure.

The calibration process in this embodiment is as follows: FIG. 6 shows a flowchart of the calibration process, and FIG. 7 shows a calibration timing diagram.

The calibration terminal Vcal_P corresponds to the integrator P, the Vcal_N corresponds to the integrator N, and all control signals for the integrators P and N are independent and do not communicate with one another. Taking a positive offset voltage VOS on the P terminal as an example, the calibration process will be described in detail below.

step 1: connecting the two input terminals VIP and VIN of the comparator to the switches S1 and S2, respectively, and connecting the switches S1 and S2 to a common-mode voltage Vcm. When the calibration of the comparator is started, a common-mode switch at the input terminal of the comparator is closed, and VIP and VIN are both connected to the common-mode voltage Vcm. At the same time, the switch $S_{int5}$ in the integrator is closed, the local calibration terminals Vcal_P and Vcal_N of the comparator are reset, the reset switch in the global calibration voltage generation module is closed to reset the global calibration voltage Vgcal, the switches $S_1$-$S_6$ are closed, such that a lower plate of the capacitor array is connected to the reference voltage Vref, and the comparator outputs first comparison results, that is, the COMP_P is at a high level;

step 2: the COMP_P is at a high level, a voltage at the calibration terminal Vcal_N needs to be increased via the integrator N. When the switch $S_{int1}$ in the integrator N corresponding to the calibration terminal Vcal_N is closed, and the switches $S_{int2}$-$S_{int4}$ are disconnected, the capacitor Cinti samples the global calibration voltage Vgcal, and the $S_{int5}$ is closed, and charge on the capacitor $C_{int3}$ is cleared, the switch $S_{int2}$ is closed, the switch $S_{int1}$ is disconnected, and the CRE is at a low level, the capacitor $C_{int1}$ and the capacitor $C_{int3}$ share the charge, $S_{int2}$ is then disconnected, the $S_{int3}$ and $S_{int4}$ are closed, the voltage after sharing is amplified by 2 times via the 2× gain amplifier and stored in $C_{int3}$, in which case, the voltage at the calibration terminal Vcal_N is increased to Vref, and integration is completed;

step 3: performing a next comparison after the integration phase is completed; and the switch $S_6$ in the global calibration voltage module is connected to the ground at the same time, in which case, the global calibration voltage Vgcal is reduced to $$\frac{1}{2}Vref;$$

step 4: determining whether to integrate the calibration voltage on the P terminal or the N terminal according to the comparison results from the step 3. When the COMP_P is at a high level, the calibration terminal Vcal_N is continuously integrated through the integrator N; specifically, the switch $S_{int1}$, in the integrator is closed, the switches $S_{int2}$-$S_{int4}$ are disconnected, the capacitor $C_{int1}$ samples the global calibration voltage Vgcal, the switch $S_{int2}$ is closed, the switch $S_{int1}$ is disconnected, the CRE is at the high level, the capacitor $C_{int1}$ and the capacitor $C_{int2}$ share the charge, the $S_{int2}$ is then disconnected, the switches $S_{int3}$ and $S_{int4}$ are closed, and the voltage after sharing is amplified by 2 times and stored in $C_{int3}$, such that the voltage at the Vcal_N terminal is increased to $$\frac{3}{2}Vref;$$

when the COMP_N is at a low level, the calibration terminal Vcal_P is integrated through the integrator P; specifically, the switch $S_{int5}$ in the integrator P is closed, the switches $S_{int2}$-$S_{int4}$ are disconnected, the capacitor $C_{int1}$ samples the global calibration voltage Vgcal, the switch $S_{int2}$ is then closed, the switch $S_{int1}$ is disconnected, and the CRE is at the lower level, the capacitor $C_{int1}$ and the capacitor $C_{int2}$ share the charge, the switch $S_{int2}$ is then disconnected, the switches $S_{int3}$ and $S_{int4}$ are closed, and the voltage after sharing is amplified by 2 times via the 2× gain amplifier and stored in $C_{int3}$, such that the voltage at the Vcal_P terminal is increased to $$\frac{1}{2}Vref;$$

step 5: the operations in the steps 3 and 4 are repeated until the global calibration voltage Vgcal reaches $$\frac{1}{64}Vref,$$

in which case, a last integration is performed according to the previous comparison results, and after the integration is completed, voltages at the output terminals Vcal_P and Vcal_N of the integrator are calibration voltages of a local comparator, which are stored on the capacitor $C_{int3}$ of the integrator, and offset calibration of the comparator is completed.

After the calibration phase is completed, the input signal is connected to the input terminal of the comparator for normal comparison operation.

According to the above calibration process, taking an $M^{th}$ comparator as an example, when output of the comparator is $B_i$ at the calibration phase, where i=0, 1, 2 . . . , N, and $B_0$ is the first comparison results while $B_N$ is an $(N+1)^{th}$ comparison results; after the calibration phase is completed, a voltage at a calibration terminal of the comparator is calculated by comparing with the results $B_N$; when $B_i$=0, the calibration terminal $$\text{Vcal\_N} < M > = \sum \frac{1}{2^i} Vref,$$

where 0≤i≤N; and when $B_i=1$, the calibration terminal $$\text{Vcal\_N} < M > = \sum \frac{1}{2^i} Vref,$$

where 0≤i≤N; and a minimum calibration step is $$\frac{1}{2^N} Vref.$$

Embodiment 3

This embodiment provides an offset calibration method for the offset calibration circuit applied to a comparator array, which is implemented by adopting the offset calibration circuit applied to a comparator array provided in Embodiment 1 or Embodiment 2, and includes the following steps:
- step 1: when the calibration of the comparator is started, a common-mode switch at the input terminal of the comparator is closed, and VIP and VIN are both connected to the common-mode voltage Vcm; the local calibration terminals Vcal_P and Vcal_N of the comparator, and the global calibration voltage Vgcal are reset, and the comparator outputs first comparison results;
- step 2: a local logic control circuit determines a calibration side according to the first comparison results of the comparator in the step 1, an integrator integrates the global calibration voltage, such that a voltage at the Vcal_P is increased by Vref, or a voltage at the Vcal_N is increased by Vref;
- step 3: step 3: the comparator performs a second comparison, the global logic control circuit controls, and the global calibration voltage is reduced from Vref to $$\frac{1}{2} Vref;$$

- step 4: the local logic control circuit further determines a calibration side according to the second output of the comparator, the integrator integrates the global calibration voltage Vgcal, such that a voltage at the Vcal_P is increased by $$\frac{1}{2} Vref,$$

or a voltage at the Vcal_N is increased by $$\frac{1}{2} Vref;$$

and the step 3 and the step 4 should be completed in a same clock cycle; and step 5: the operations in the steps 3 and 4 are repeated until the global calibration voltage Vgcal reaches $$\frac{1}{2^N} Vref,$$

in which case, a last integration is performed according to the previous comparison results, and after the integration is completed, voltages at the output terminals Vcal_P and Vcal_N of the integrator are calibration voltages of a local comparator, and offset calibration of the comparator is completed.

Some of the steps in the embodiments of the present disclosure may be implemented using software, and the corresponding software programs can be stored on a readable storage medium, such as an optical disk or a hard disk.

What is described above is merely preferred embodiments of the present disclosure, and is not intended to limit the present disclosure. Any modifications, equivalent replacements and improvements, etc. made within the spirit and principle of the present disclosure should fall within the scope of protection of the present disclosure.

What is claimed is:

1. An offset calibration circuit applied to a comparator array, comprising a global calibration voltage generation module, integrators, comparators, a global logic control circuit, and local logic control circuits, wherein an output terminal of the global logic control circuit is connected to a control terminal of the global calibration voltage generation module, and is configured to generate a control signal required by the global calibration voltage generation module; an output terminal of the global calibration voltage generation module is connected to input terminals of the integrators and is configured to generate a voltage required for calibrating the entire comparator array; one comparator is arranged for every two integrators, output terminals of the two integrators are connected to calibration terminals of one comparator, respectively, and the integrators are configured to integrate the voltage generated by the global calibration voltage generation module in a calibration phase, and to maintain the calibration voltage after integration in a normal working phase of the comparator; and input terminals of the local logic control circuits are connected to output terminals of the comparators, output terminals of the local logic control circuits are connected to control terminals of the integrators and are configured to generate control signals required by the integrators.

2. The offset calibration circuit applied to a comparator array according to claim 1, wherein the one comparator has two calibration terminals Vcal_P and Vcal_N, and the calibration terminals Vcal_P and Vcal_N are gates of calibration pair transistors connected in parallel with input pair transistors of the comparator or are substrates of the input pair transistors of the comparator.

3. The offset calibration circuit applied to a comparator array according to claim 1, wherein when the calibration is started, the global logic control circuit generates a control signal to control the global calibration voltage generation module to generate a global calibration voltage Vgcal with sequentially magnitudes of $$Vref, \frac{1}{2} Vref, \frac{1}{4} Vref \ldots\ldots \frac{1}{2^N} Vref$$

after the comparator makes comparison each time.

4. The offset calibration circuit applied to a comparator array according to claim 1, wherein the global calibration voltage generation module is composed of a capacitor array, a reset switch, a switch array and a buffer; the capacitor array is connected in parallel, a lower plate of each of the capacitors is connected to one switch, an upper plate of each of the capacitors is connected to a positive terminal of the buffer, and a negative terminal of the buffer is connected to the global calibration voltage Vgcal; the switch array is connected to the global logic control circuit, the global logic control circuit controls each of the switches to be connected to a reference voltage or a ground, the reset switch is connected in parallel to the capacitor array; and when the reset switch is closed, upper plates of all of the capacitors are connected to the reference voltage for resetting the capacitor array.

5. The offset calibration circuit applied to a comparator array according to claim 1, wherein the integrators consist of switches $S_{int1}$-$S_{int5}$, capacitors $C_{int1}$-$C_{int3}$, a 2× gain amplifier, and one selector, the capacitors $C_{int1}$-$C_{int3}$ have equal capacitance, and the selector is controlled by a control signal CRE:

when the CRE is at a high level, an upper plate of the capacitor $C_{int2}$ is connected between the switch $S_{int2}$ and the switch $S_{int3}$, while the capacitor $C_{int3}$ is connected to an output terminal of one integrator;

when the CRE is at a low level, an upper plate of the capacitor $C_{int3}$ is connected between the switch $S_{int2}$ and the switch $S_{int3}$, while the capacitor $C_{int2}$ is connected to an output terminal of one integrator; and the global calibration voltage Vgcal is connected to an upper plate of the capacitor Cinti through the switch $S_{int1}$, the upper plate of the capacitor $C_{int1}$ is connected to the upper plate of the capacitor $C_{int2}$ through the switch $S_{int2}$, the upper plate of the capacitor $C_{int2}$ is connected to an input terminal of the 2× gain amplifier through the switch $S_{int3}$, an output terminal of the 2× gain amplifier is connected to the calibration terminal Vcal_P or Vcal_N of the comparator through the switch $S_{int4}$, the upper plate of the capacitor $C_{int3}$ is connected to an output terminal, lower plates of all of the capacitors are connected to the ground, and the reset switch $S_{int5}$ is connected in series with the output terminal and the ground for resetting an output voltage.

6. A calibration method for an offset calibration circuit applied to a comparator array, wherein the method is implemented based on the offset calibration circuit according to claim 1, and the method comprises:

step 1: when a comparator starts the calibration, input terminals of the comparator VIP and VIN are both connected to a common-mode voltage Vcm, local calibration terminals Vcal_P and Vcal_N of the comparator and a global calibration voltage Vgcal are reset, and the comparator outputs first comparison results;

step 2: a local logic control circuit determines a calibration side according to the first comparison results of the comparator in the step 1, an integrator integrates the global calibration voltage, such that a voltage at the Vcal_P is increased by Vref, or a voltage at the Vcal_N is increased by Vref; and the comparator outputs second comparison results;

step 3: a global logic control circuit controls a global calibration voltage generation module, such that a global calibration voltage is reduced from Vref to $$\frac{1}{2}Vref;$$

step 4: the local logic control circuit determines a calibration side according to the second comparison results of the comparator in the step 2, the integrator integrates the global calibration voltage Vgcal, such that a voltage at the Vcal_P is increased by $$\frac{1}{2}Vref,$$

or a voltage at the Vcal_N is increased by $$\frac{1}{2}Vref;$$

and the comparator outputs third comparison results; and step 5: the operations in the steps 3 and 4 are repeated until the global calibration voltage Vgcal outputted by the global calibration voltage generation module is $$\frac{1}{2^N}Vref,$$

in which case, a last integration is performed according to the previous comparison results, and after the integration is completed, voltages at the calibration terminals Vcal_P and Vcal_N are calibration voltages of a local comparator, and offset calibration of the comparator is completed.

7. The method according to claim 6, wherein a method that the local logic control circuit determines a calibration side in the step 4 is as follows:

when the comparator outputs a high level after one comparison in a calibration phase is completed, a voltage at the Vcal_N terminal will be increased by the global calibration voltage Vgcal through the integrator, while a voltage at the Vcal_P terminal remains unchanged; and when the comparator outputs a low level after one comparison in the calibration phase is completed, a voltage at the Vcal_P terminal will be increased by the global calibration voltage Vgcal through the integrator, while a voltage at the Vcal_N terminal remains unchanged.

8. An image sensor, wherein the image sensor adopts the offset calibration circuit applied to a comparator array according to claim 1.

9. A computing-in-memory chip, wherein the computing-in-memory chip adopts the offset calibration circuit applied to a comparator array according to claim 1.

* * * * *